(12) United States Patent
Szleszynski et al.

(10) Patent No.: US 9,039,275 B2
(45) Date of Patent: May 26, 2015

(54) METHODS OF PREVENTING FREEZING OF RELAYS IN ELECTRICAL COMPONENTS

(75) Inventors: Greg Szleszynski, Troy, MI (US); Adrian Dobre, West Bloomfield, MI (US); Teofil Barjuca, West Bloomfield, MI (US); Ryutaro Mine, Farmington Hills, MI (US); Jim Beach, Plymouth, MI (US); Adam Wehner, South Lyon, MI (US); Tim Balogh, Waterford, MI (US)

(73) Assignee: Nissan North America, Inc., Franklin, TN (US)

( * ) Notice: Subject to any disclaimer, the term of this patent is extended or adjusted under 35 U.S.C. 154(b) by 521 days.

(21) Appl. No.: 13/350,009

(22) Filed: Jan. 13, 2012

(65) Prior Publication Data

US 2013/0181732 A1    Jul. 18, 2013

(51) Int. Cl.
*G01N 25/00*     (2006.01)
*G01R 31/00*     (2006.01)
*H01H 47/00*     (2006.01)
*G01R 31/327*    (2006.01)

(52) U.S. Cl.
CPC .......... *H01H 47/002* (2013.01); *G01R 31/3278* (2013.01); *G01R 31/006* (2013.01)

(58) Field of Classification Search
CPC ....................................................... G01R 1/00
USPC ............ 374/45, E1.018, 208, 57; 324/750.03
See application file for complete search history.

(56) References Cited

U.S. PATENT DOCUMENTS

| | | | | |
|---|---|---|---|---|
| 4,884,413 | A * | 12/1989 | Quandt et al. | 62/135 |
| 5,363,667 | A * | 11/1994 | Janke et al. | 62/131 |
| 6,257,319 | B1 * | 7/2001 | Kainuma et al. | 165/11.1 |
| 2003/0197518 | A1* | 10/2003 | Miyakita | 324/750 |
| 2005/0132726 | A1* | 6/2005 | Sasaki et al. | 62/129 |
| 2005/0235663 | A1* | 10/2005 | Pham | 62/126 |
| 2007/0130968 | A1* | 6/2007 | Kaga et al. | 62/157 |

* cited by examiner

*Primary Examiner* — Lisa Caputo
*Assistant Examiner* — Nasir U Ahmed
(74) *Attorney, Agent, or Firm* — Young, Basile, Hanlon & MacFarlane, P.C.

(57) ABSTRACT

Disclosed herein are methods of preventing freezing of relays in electrical components operated in specific atmospheric conditions. One such method described herein comprises monitoring a temperature of a relay with a thermocouple located on a contact of the relay while monitoring ambient temperature within the relay. Operation of the electrical component is simulated in a sub-zero temperature and high humidity condition. A freeze potential of the relay is determined by plotting a temperature cross-over curve, wherein both the ambient temperature and the contact temperature are plotted during the operation and cool down period. If the high freeze potential is determined, one or both of the relay and the electrical component are modified with a modification configured to decrease the high freeze potential.

20 Claims, 6 Drawing Sheets

FIG. 9

METHODS OF PREVENTING FREEZING OF RELAYS IN ELECTRICAL COMPONENTS

BACKGROUND

Because vehicles can have a global market, vehicles are manufactured to operate under most weather conditions, including extreme heat and extreme cold. Because vehicles are made from a multitude of components provided by a multitude of suppliers, these components must also be made to operate under the same weather conditions. Different areas of the world present different weather challenges, and until a vehicle is operated in a particular area with severe and unusual weather conditions, vehicle component operating problems may not be anticipated until the actual weather condition is experienced. Testing components under these severe and unusual weather challenges would enable prevention of the potential problems caused by such weather.

SUMMARY

Disclosed herein are methods of preventing freezing of relays in electrical components operated in specific atmospheric conditions. One such method comprises simulating operation of the electrical component in a sub-zero temperature and high humidity condition, simulating cool down of the electrical component un-powered in the sub-zero temperature and high humidity condition and determining a freeze potential of the relay.

Another method described herein comprises monitoring a temperature of a relay with a thermocouple located on a contact of the relay while monitoring ambient temperature within the relay. Operation of the electrical component is simulated in a sub-zero temperature and high humidity condition. A freeze potential of the relay is determined by plotting a temperature cross-over curve, wherein both the ambient temperature and the contact temperature are plotted during the operation and cool down period, wherein if the contact temperature and the ambient temperature cross on the temperature cross-over curve, a high freeze potential of the relay is determined and if the contact temperature and the ambient temperature do not cross on the temperature cross-over curve, a low freeze potential of the relay is determined. If the high freeze potential is determined, one or both of the relay and the electrical component are modified with a modification configured to decrease the high freeze potential.

Another method of preventing freezing of relays in an electrical component comprises placing the electrical component in a chamber with temperature control configured to control a temperature of an internal atmosphere of the chamber, reducing the temperature of the internal atmosphere of the chamber to a sub-zero temperature and humidifying the internal atmosphere of the chamber with saturated air supplied from a humidifier in fluid communication with the internal atmosphere. Power is provided to the electrical component for a first period of time. The electrical component is then left un-powered for a second period of time. Power is provided to the electrical component for a second time and a freeze potential of the relay is determined, wherein a low freeze potential is determined if the contacts of the relays close when power is provided for the second time and a high freeze potential is determined if the contacts of the relay do not close when power is provided for the second time. If the high freeze potential is determined, one or both of the electrical component and the relay are modified for use in actual operation, with the modification configured to decrease the high freeze potential.

BRIEF DESCRIPTION OF THE DRAWINGS

The various features, advantages and other uses of the present apparatus will become more apparent by referring to the following detailed description and drawing in which.

DETAILED DESCRIPTION

Some areas of the world experience sub-zero weather conditions on a routine basis. Vehicles are designed to operate in these sub-zero temperatures by simulating such conditions and finding solutions when operating issues arise under the simulated conditions. However, certain weather conditions have been difficult to simulate and, as a result, are often not simulated, resulting in operating issues arising during operation of the vehicle by a customer when these certain weather conditions occur.

One of the weather conditions that have been difficult and costly to simulate is severe cold coupled with humidity. Although severe cold has been simulated, the resulting atmosphere typically has low or no humidity. The combination of the severe cold with humidity presents unique challenges to some vehicle components that could be addressed if the vehicle or vehicle components could be tested in such a simulated atmosphere prior to being sold.

Figure 1:
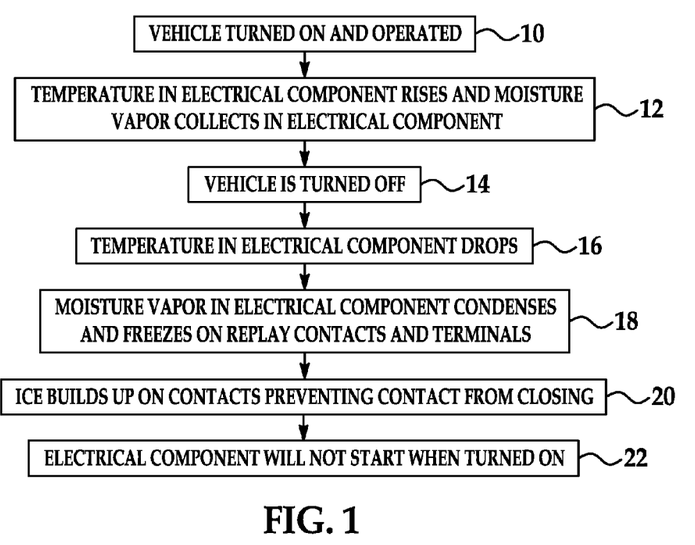
FIG. 1 is a flow diagram of conditions within an electrical component that can lead to the non-start condition.

One non-limiting example of a problem arising from the combination of severe cold and humidity occurs with the relay or relays within an electrical component of a vehicle. As a non-limiting example, relays within the power distribution module of the vehicle that supply current to the starter circuit during start-up of the vehicle can be affected. Under certain conditions, these relays could potentially freeze and prevent the vehicle from starting. The inventors discovered the cause of the problem. FIG. 1 is a flow diagram of the conditions within the power distribution module that can lead to the non-start condition.

Figure 2A:
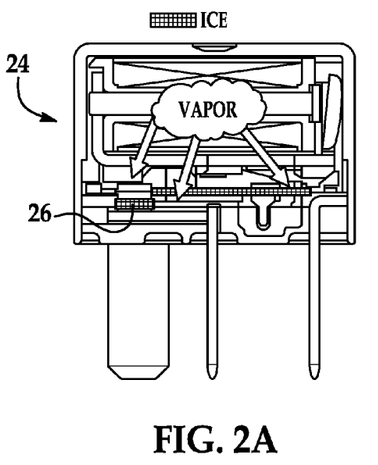
FIGS. 2A and 2B are schematics of a relay in freezing conditions.
Figure 2B:
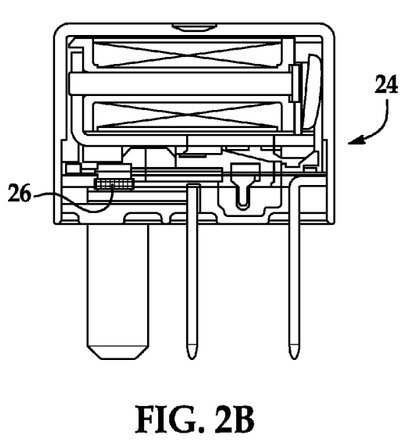

As shown in FIG. 1, when the vehicle is operated (10), the temperature of the power distribution module rises and moisture vapor is formed (12). When the vehicle is turned off (14), the temperature within the power distribution module drops (16). As the temperature drops, the moisture condenses and freezes (18). One of the places that the condensed moisture freezes is on the relays, and in particular, on the relay contacts. FIG. 2A is a schematic of a relay 24 for use in an electrical component with the moisture vapor condensing at the low points of the relay and freezing. If the temperature of the contact 26 drops below the ambient air temperature, moisture in the air condenses and forms ice on the contacts, and the contacts are prevented from closing (20). When a user attempts to start the vehicle again, the electrical component fails to operate as the ice on the relays is preventing the contacts from closing (22). FIG. 2B is a schematic of ice built up on the contact 26 within the relay 24.

Figure 3:
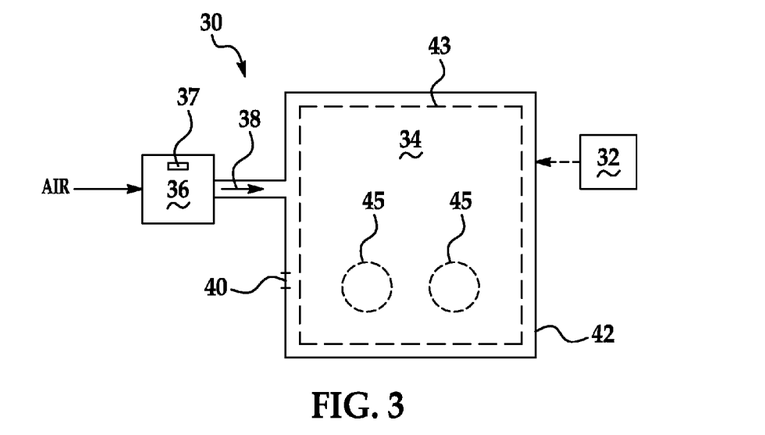
FIG. 3 is a schematic of a test chamber for simulating conditions to prevent freezing of relays in an electrical component.

In order to solve this problem, the inventors developed an apparatus for replicating the conditions in which the problem occurs. FIG. 3 is a schematic of a test chamber 30 to simulate low temperature and high humidity atmospheric conditions. The test chamber 30 has a temperature control 32 configured to control the temperature of an internal atmosphere 34 of the test chamber 30. A humidifier 36 is in fluid communication with the internal atmosphere 34 of the test chamber 30 and is configured to selectively supply humidified air 38 to the internal atmosphere 34. A sealable opening 40 in a wall 42 of the test chamber 30 is configured to pass a wire harness (shown in FIG. 4) from external the test chamber 30 to within the internal atmosphere 34 of the test chamber 30 while maintaining a sealed environment within the test chamber 30. The temperature control 32 is configured to maintain the internal atmosphere 34 at a sub-zero temperature while the humidifier 36 maintains a saturated internal atmosphere 34.

The temperature control 32 is configured to selectively maintain the set temperature of the internal atmosphere 34. The set temperature of the internal atmosphere can range from about −30° C. to 110° C. as a non-limiting example. The humidity controller 37 for the humidifier 36 is configured to selectively produce relative humidity up to 90% or higher while the set temperature is maintained.

The test chamber 30 can have a window 43, shown in broken line, through which one can monitor the internal atmosphere 34 of the test chamber 30. The window 43 can be a second door which seals closed to the test chamber 30 or can be a sealed transparent opening in a wall. Monitoring the internal atmosphere 34 may be desirable to protect the equipment from damage due to freezing as the sub-zero temperature and high humidity conditions can lead to snow and ice build-up in the equipment.

The test chamber 30 can also include one or more sealable apertures 45, also shown in broken line, that allow a user to reach into the internal atmosphere 34 without disturbing the conditions of the atmosphere and manipulate an electrical component that is being tested.

Figure 4:
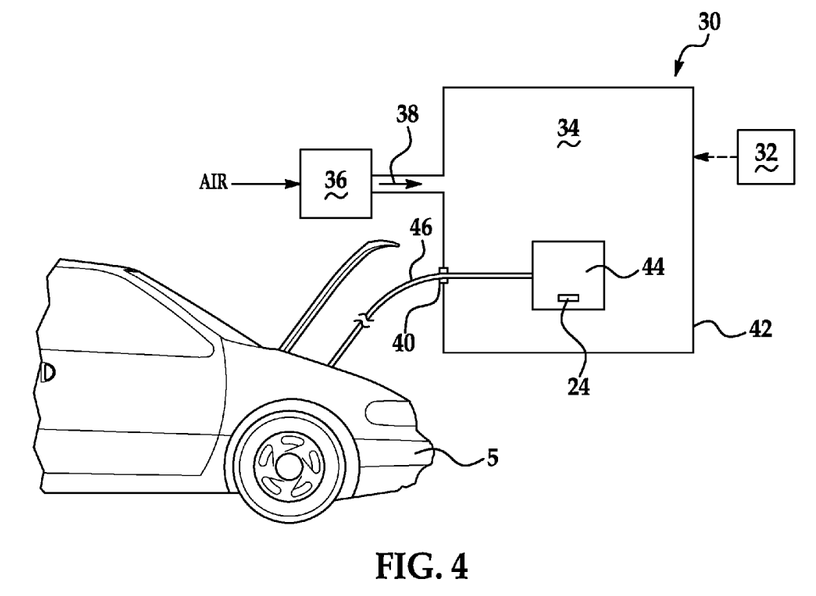
FIG. 4 is the schematic of the test chamber of FIG. 3 in use.

FIG. 4 is a schematic of the test chamber 30 of FIG. 3 in operation testing an electrical component of a vehicle 5. As used in this example, one or more relays 24 within the electrical component 44 of a vehicle 5 are being tested. As illustrated, a wire harness 46 is passed through the sealable opening 40 in the wall 42 of the test chamber 30 and connects the vehicle 5 to the electrical component 44 to power the electrical component 44. The electrical component 44 is sealed in the test chamber 30 so that the internal atmosphere 34 of the test chamber 30 can be efficiently manipulated to replicate the desired temperature and humidity conditions.

It is contemplated that instead of the vehicle 5, a power generator can be attached to the wire harness 46 to supply power to the electrical component 44 in the test chamber 30. The entry for the humidifier 36 and the sealable opening 40 for the wire harness 46 are shown in wall 42 as a non-liming example. The entry for the humidifier 36 and the sealable opening 40 can be in any wall and do not have to be on the same wall. It is also contemplated that the test chamber 30 be of a sufficient size to test components while in the vehicle 5.

Figure 5:
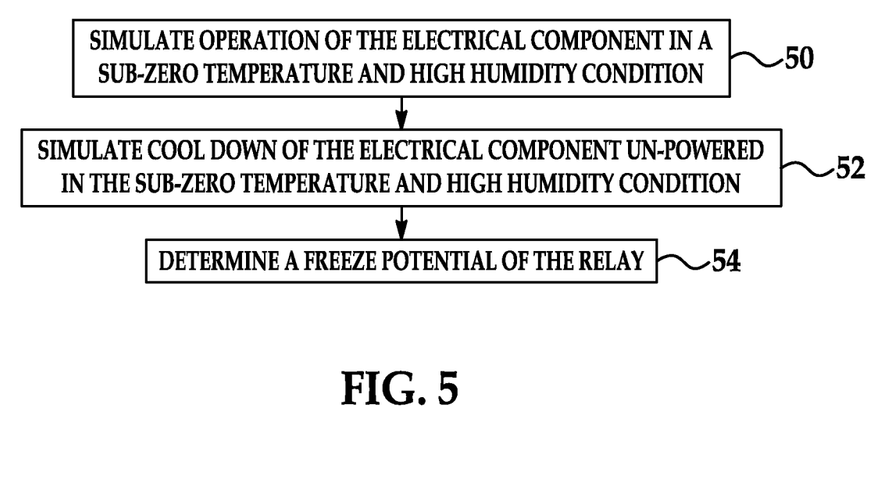
FIG. 5 is a flow diagram of a method of preventing freezing of relays in an electrical component.

FIG. 5 is a flow diagram of a method that utilizes the test chamber 30 disclosed herein. The method of FIG. 5 prevents freezing of relays 24 in an electrical component 44 of a vehicle 5. The method comprises the step 50 of simulating operation of the electrical component in a sub-zero temperature and high humidity condition. In step 52, the electrical component is allowed to cool down in an un-powered state in the sub-zero temperature and high humidity condition. In step 54, the freeze potential of the relay is determined.

Figure 6:
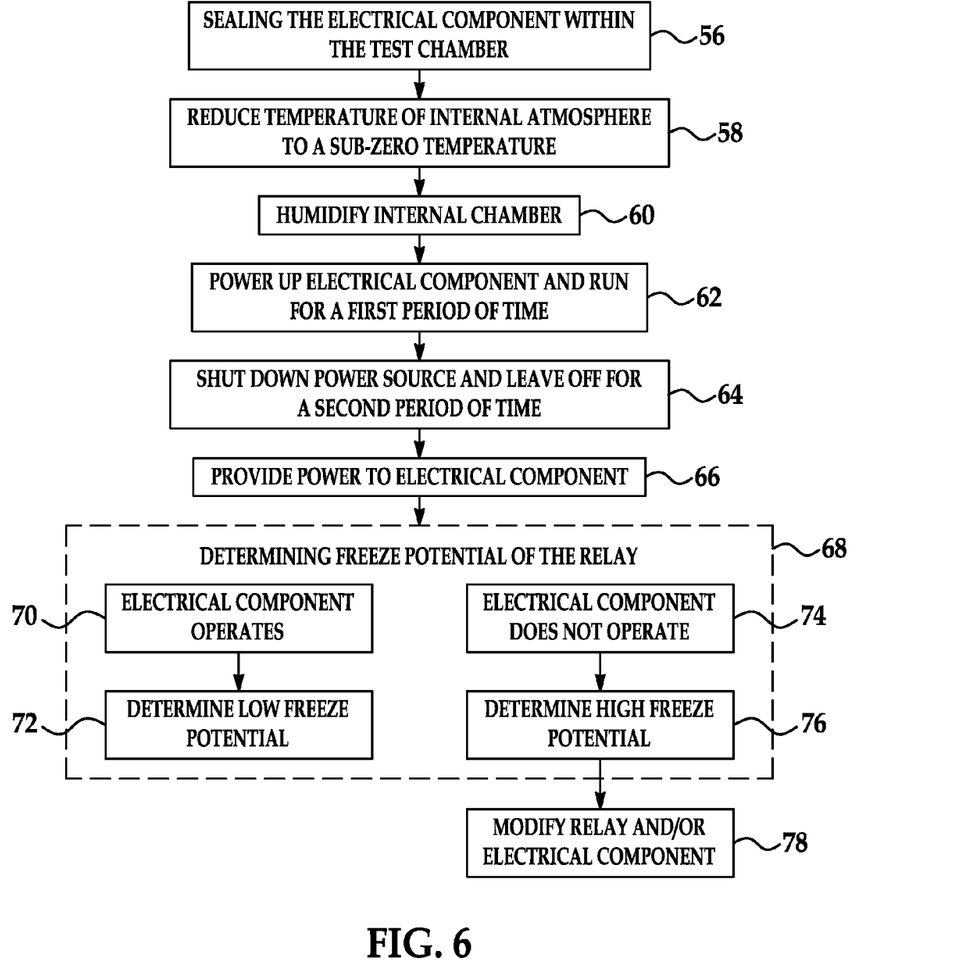
FIG. 6 is a flow diagram of another method of preventing freezing of relays in an electrical component.

FIG. 6 is a flow diagram of another method that utilizes the test chamber 30 disclosed herein. The method of FIG. 6 prevents freezing of relays 24 in an electrical component 44 of a vehicle 5. The method comprises the step 56 of sealing the electrical component 44 having the relay 24 within the test chamber 30. The test chamber 30 has a temperature control 32 that is configured to control a temperature of an internal atmosphere 34 of the test chamber 30. The electrical component 44 is connected to the wire harness 46 while in the test chamber 30 to receive power from a power source. The test chamber 30 should be sealed to improve and make regulation of the atmospheric condition within the test chamber 30 more reliable and repeatable.

In step 58, the temperature of the internal atmosphere 34 of the test chamber 30 is reduced to a sub-zero temperature. As a non-limiting example, the temperature can be reduced to below zero to as low as −30° C. In particular, the temperature can be reduced to −20° C. or below. The internal atmosphere 34 of the test chamber 30 is then humidified with saturated air supplied from the humidifier 36 in step 60, which is in fluid communication with the internal atmosphere 34. The relative humidity of the internal chamber 34 can be as saturated as possible without producing snow in the internal chamber 34. Some snow can be produced, but the amount of snow should be limited so that it does not infiltrate the controls of the chamber 30 and cause them to freeze over and disrupt operation of the chamber 30. As a non-limiting example, the relative humidity can be 90% or higher.

In step 62, the electrical component 44 is provided with power from the power source for a first period of time, simulating operation of the electrical component 44 by idling the power source in a sub-zero temperature atmosphere with humidity. The first period of time can be any length of time. A non-limiting example the first period of time is a sufficient time that heats the power distribution module to operating temperature while maintaining an efficient test schedule, such as approximately ten minutes. The power source is then shut down in step 64 and the electrical component 44 is left un-powered for a second period of time in the same sub-zero temperature atmosphere with humidity. The second period of time can be any length of time that allows the power distribution module sufficient time to cool to atmospheric temperature, such as approximately sixty minutes. The second period of time is typically longer than the first period of time. In step 66, power is provided to the electrical component 44 for a second time.

A freeze potential of the relay 24 is determined in step 68. A low freeze potential is determined in step 72 if the electrical component 44 starts up in step 70 when power is provided for the second time to the electrical component 44. A high freeze potential is determined in step 76 if the electrical component 44 does not start up in step 74 when power is provided for the second time to the electrical component 44.

The method in FIG. 6 can further include modification in step 78. If the high freeze potential is determined, a modification is made in step 78 to the relay 24 and/or the electrical component 44 configured to decrease the high freeze potential. The modified relay 24 and/or electrical component 44 can be retested to confirm that the freeze potential has been reduce to a low freeze potential.

One example of an electrical component 44 having relays 24 that are tested by the methods disclosed herein is a power distribution module. The relays 24 within the power distribution module can freeze in humid sub-zero temperature conditions. Ice builds up on the contacts 26 of the relays 24 when the moisture vapor condenses and freezes. The ice buildup prevents closure of the contacts 26, which prevents current flow and renders the vehicle 5 inoperable as the engine will not start. When the power distribution module is the electrical component 44 being tested, and the problem occurs, one or both of the relays 24 and the power distribution module can be modified to prevent the ice build-up on the contacts 26.

The modification can include one or more of removing existing heat dissipaters from the power distribution module; adding ventilation to one or both of the power distribution module and the relay; moving the relay to a different location within the power distribution module; and moving the power distribution module to a different location within an engine compartment of the vehicle. These modifications are provided as non-limiting examples. Any modification known to those skilled in the art that would achieve the desired results is contemplated herein.

Figure 7:
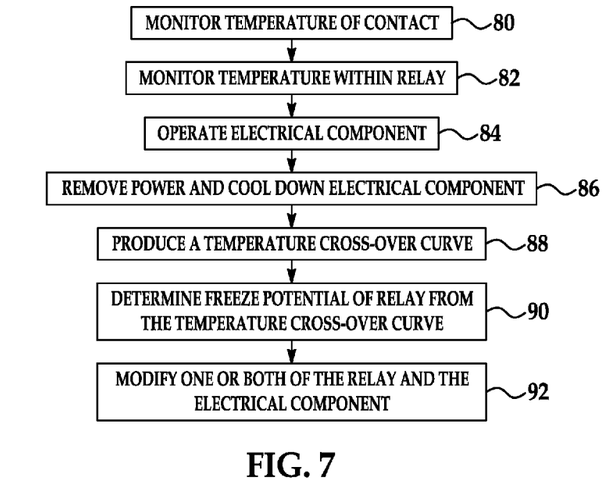
FIG. 7 is a flow diagram of yet another method of preventing freezing of relays in an electrical component.

Another method of preventing freezing of relays in electrical components is disclosed herein with regard to FIG. 7. The method shown in FIG. 7 also utilizes the test chamber 30 disclosed herein. As shown in FIG. 7, the method comprises monitoring a temperature of a contact 26 in a relay 24 with a first thermocouple located on the contact 26 in step 80. At the same time, the ambient temperature within the relay 24 is monitored with a second thermocouple in step 82. While the temperatures are being monitored, operation of the electrical component 44 within which the relay 24 resides is simulated in step 84 in an atmosphere with a sub-zero temperature and high humidity condition.

Simulating operation of the electrical component in step 84 can include placing the electrical component 44 in a test chamber 30 as disclosed herein with temperature control 32 configured to control a temperature of an internal atmosphere 34 of the test chamber 30. The temperature of the internal atmosphere 34 of the test chamber 30 is reduced to a sub-zero temperature and the internal atmosphere 34 is humidified with saturated air supplied from a humidifier 36 in fluid communication with the internal atmosphere 34. Power is provided to the electrical component 44 for a first period of time. The first period of time can be any time sufficient to bring the electrical component 44 up to operating temperature. For example, the first period of time can be approximately ten minutes.

The humid, sub-zero temperature atmosphere can be produced in the test chamber 30 disclosed herein. As a non-limiting example, the temperature can be reduced to below zero to as low as −30° C. In particular, the temperature can be reduced to −20° C. or below. The internal atmosphere 34 of the test chamber 30 is then humidified with saturated air supplied from the humidifier 36 to produce the humidity. The relative humidity of the internal chamber 34 can be as saturated as possible without producing snow in the internal chamber 34. As a non-limiting example, the relative humidity can be 90% or higher.

In step 86, power to the electrical component 44 is stopped and the electrical component cools down in the atmosphere with a sub-zero temperature and high humidity condition. Monitoring of the contact temperature and ambient temperature continues to be monitored during the cool down period.

Figure 8A:
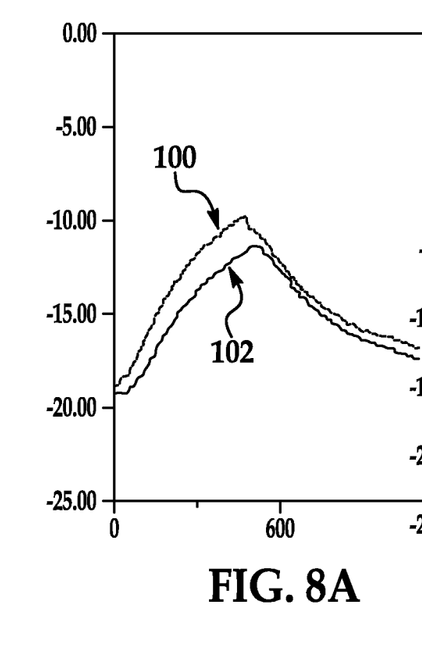
FIGS. 8A and 8B depict temperature cross-over graphs.
Figure 8B:
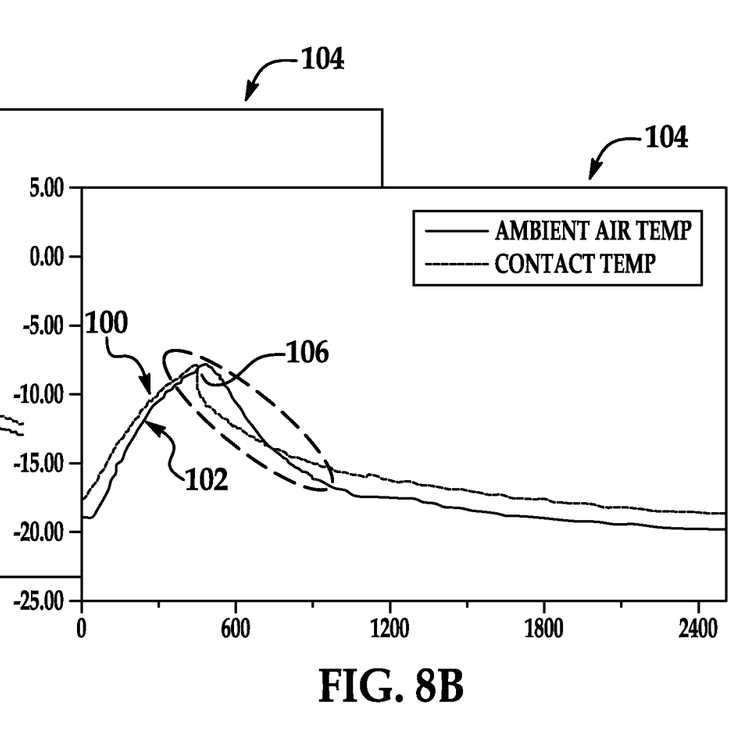

In step 88, the contact temperature 100 and the ambient temperature 102 are plotted as shown in FIGS. 8A and 8B. The freeze potential of the relay 24 is determined in step 90 by the temperature cross-over curve 104 produced from plotting the contact temperature 100 and the ambient temperature 102 against time. If the contact temperature 100 drops faster than the ambient temperature 102, and the drop is fast enough that the contact temperature 100 and the ambient temperature 102 have a crossing point 106 on the temperature cross-over curve 104, as shown in FIG. 8B, a high freeze potential of the relay 24 is determined. If the contact temperature 100 and the ambient temperature 102 do not cross on the temperature cross-over curve 104, as shown in FIG. 8A, a low freeze potential of the relay 24 is determined. If the relay 24 is determined to have a high freeze potential, one or both of the relay 24 and the electrical component 44 can be modified in step 92 to decrease the high freeze potential.

One example of an electrical component 44 having relays 24 that are tested by the methods disclosed herein is a power distribution module. The power distribution module is sealed within the test chamber 30 and connected to a vehicle 5 with a wire harness 46 to power the power distribution module. The vehicle 5 is started and idled for a first period of time, simulating operation of the electrical component 44 in a sub-zero temperature atmosphere with humidity. The first period of time can be any length of time. A non-limiting example the first period of time is a sufficient time that heats the power distribution module to operating temperature while maintaining an efficient test schedule, such as approximately ten minutes. The vehicle 5 is then turned off and the power distribution module is left un-powered to cool down for a second period of time in the same sub-zero temperature atmosphere with humidity. The second period of time can be any length of time that allows the power distribution module sufficient time to cool to atmospheric temperature, such as approximately sixty minutes. The second period of time is typically longer than the first period of time.

If the temperature cross-over curve 104 has a crossing point 106 as in FIG. 8B, the relays 24 within the power distribution module can freeze in humid sub-zero temperature conditions. Ice builds up on the contacts 26 of the relays 24 when the moisture vapor condenses and freezes. The ice buildup prevents closure of the contacts 26, which prevents current flow and renders the vehicle 5 inoperable as the engine will not start. When the power distribution module is the electrical component 44 being tested, and the problem occurs, one or both of the relays 24 and the power distribution module can be modified to prevent the ice build-up on the contacts 26.

The modification can include one or more of removing existing heat dissipaters from the power distribution module; adding ventilation to one or both of the power distribution module and the relay; moving the relay to a different location within the power distribution module; and moving the power distribution module to a different location within an engine compartment of the vehicle. These modifications are provided as non-limiting examples. Any modification known to those skilled in the art that would achieve the desired results is contemplated herein.

Any of the methods herein can include pre-conditioning the relay prior to simulating operation of the electrical component. The pre-conditioning can occur before temperature monitoring in the second disclosed method, but the temperatures can also be monitored during pre-conditioning.

Figure 9:
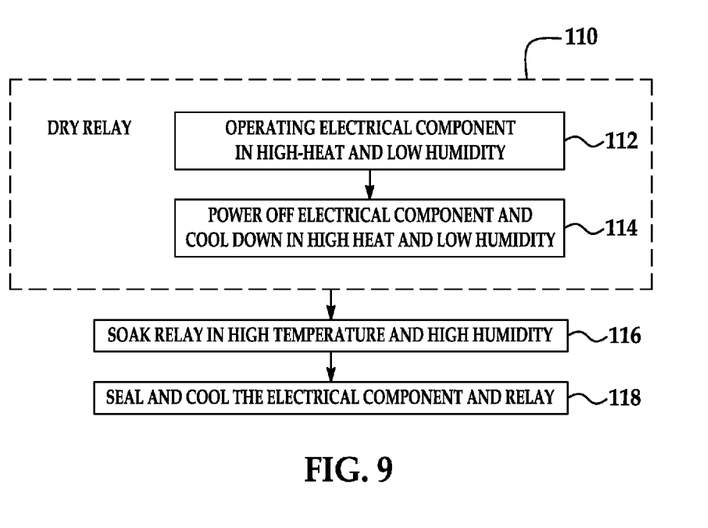
FIG. 9 is a flow diagram of a pre-conditioning method that can be used with the prevention methods disclosed herein.

FIG. 9 illustrates pre-conditioning of the relay 24. In step 110 of pre-conditioning, the relay 24 is dried for a third period of time. The drying in step 110 can comprise operating the electrical component 44 in a high heat and low humidity condition in step 112 and holding the electrical component 44 in the high heat and low humidity condition in a power-off state in step 114. The drying step can take place at sufficient temperature to remove moisture from the electrical component 44. As a non-limiting example, the drying can occur at about 100° C. and zero or low humidity.

After drying, the relay 24 is soaked in a high temperature and high humidity condition for a fourth period of time in step 116. The high temperature and high humidity condition can occur at a temperature of about 80° C. or higher and a humidity of about 90% relative humidity or higher as a non-limiting example. The fourth period of time can be any sufficient amount of time known to those skilled in the art. As a non-limiting example, the fourth period of time is about 90 hours or greater. The relay 24 is sealed in a sealable container within the test chamber 30 and is then cooled from the high temperature, to room temperature, and then to a sub-zero temperature in step 118. The electrical component 44 can be disconnected from the wire harness 46 for this step and to achieve a tight seal within the container. When the sub-zero temperature is reached, the relay 24 is held at the sub-zero temperature for a fifth period of time in step 120. The sub-zero temperature can be as low as allowed by the test chamber 30. In particular, the sub-zero temperature can be about −20° C. or below. The fifth period of time can be about 20 hours or greater as a non-limiting example.

When pre-conditioning is complete, the electrical component 44 can be removed from the sealed container and reattached to the wire harness 46. Simulation of operation of the electrical component 44 can then be initiated as disclosed in the methods herein.

The examples provided test one electrical component at a time. However, it is contemplated that a plurality of electrical components are tested at the same time, limited only by the area within the test chamber 30. Different relays may have different temperature cross-over profiles depending on the electrical component in which the respective relay is located. When the temperature cross-over profile is created for a relay in an electrical component, the temperature cross-over profile can be used to easily test different manufacturers and different modifications to confirm a low freeze potential of the relay.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A method of preventing freezing of relays in an electrical component comprising:
    operating the electrical component in a sub-zero temperature and high humidity condition;
    cooling down of the electrical component un-powered in the sub-zero temperature and high humidity condition; and
    determining a freeze potential of the relay from a temperature cross-over curve.

2. The method of claim 1, wherein determining the freeze potential of the relay comprises:
    monitoring a temperature of a contact within the relay with a first thermocouple located on the contact;
    concurrently monitoring ambient temperature within the relay with a second thermocouple during the operating and the cooling down; and
    plotting the temperature cross-over curve, wherein both the ambient temperature and the temperature of the contact are plotted during the operating and the cooling down, wherein if the temperature of the contact and the ambient temperature cross on the temperature cross-over curve, a high freeze potential of the relay is determined and if the temperature of the contact and the ambient temperature do not cross on the temperature cross-over curve, a low freeze potential of the relay is determined.

3. The method of claim 2, wherein the electrical component is a power distribution module of a vehicle and the simulating operation of the relay comprises idling the vehicle for a first period of time, leaving the vehicle un-powered for a second period of time, and restarting the vehicle.

4. The method of claim 3, wherein the second period of time is greater than the first period of time.

5. The method of claim 3, wherein if the high freeze potential is determined, the method further comprises:
    modifying one or both of the relay and the electrical component with a modification configured to decrease the high freeze potential.

6. The method of claim 5, wherein the modification is selected from the group consisting of: removing existing heat dissipaters from the power distribution module, adding ventilation to the power distribution module, moving the relay to a different location within the power distribution module, moving the power distribution module to a different location within an engine compartment of the vehicle and combinations thereof.

7. The method of claim 1, wherein the low temperature and high humidity condition is at or below −20° C. and at or above 90% relative humidity.

8. The method of claim 1 further comprising pre-conditioning the relay prior to the operating.

9. The method of claim 8, wherein pre-conditioning comprises:
    drying the relay for a third period of time;
    soaking the relay in a high temperature and high humidity condition for a fourth period of time;
    cooling the relay to a sub-zero temperature; and
    holding the relay at the sub-zero temperature for a fifth period of time.

10. The method of claim 9, wherein drying comprises:
    operating the electrical component in a high heat and low humidity condition; and
    holding the electrical component in the high heat and low humidity condition in a power-off state.

11. The method of claim 9, wherein the high temperature and high humidity condition comprises a temperature of about 80° C. or higher and a humidity of about 90% relative humidity or higher.

12. The method of claim 9, wherein the fourth period of time is about 90 hours or greater.

13. The method of claim 9, wherein the sub-zero temperature is about −20° C. or below.

14. The method of claim 9, wherein the fifth period of time is about 20 hours or greater.

15. The method of claim 1, wherein the operating of the electrical component comprises:
    placing the electrical component in a chamber with temperature control configured to control a temperature of an internal atmosphere of the chamber;
    reducing the temperature of the internal atmosphere of the chamber to a sub-zero temperature;

humidifying the internal atmosphere of the chamber with saturated air supplied from a humidifier in fluid communication with the internal atmosphere; and providing power to the electrical component for a first period of time.

16. The method of claim 1 further comprising:

placing the electrical component in a chamber with temperature control configured to control a temperature of an internal atmosphere of the chamber;

reducing the temperature of the internal atmosphere of the chamber to a sub-zero temperature; and humidifying the internal atmosphere of the chamber with saturated air supplied from a humidifier in fluid communication with the internal atmosphere.

17. The method of claim 16, wherein the operating comprises providing power to the electrical component for a first period of time while the electrical component is sealed in the chamber and the cooling down comprises leaving the electrical component un-powered for a second period of time.

18. The method of claim 17, wherein determining the freeze potential of the relay comprises:

providing power to the electrical component for a second time, wherein a low freeze potential is determined if contacts of the relay close when power is provided for the second period of time and a high freeze potential is determined if the contacts of the relay do not close when power is provided for the second period of time.

19. The method of claim 18, wherein the electrical component is a power distribution module of a vehicle and the contacts of the relay closing is indicated by the vehicle starting, and failure of the contacts to close is indicated by the vehicle failing to start.

20. A method of preventing freezing of relays in an electrical component comprising:

monitoring a temperature of a contact within a relay with a first thermocouple located on the contact;

concurrently monitoring ambient temperature within the relay with a second thermocouple;

operating the electrical component in a sub-zero temperature and high humidity condition during temperature monitoring;

cooling down of the electrical component un-powered in the sub-zero temperature and high humidity condition during temperature monitoring; and determining a freeze potential of the relay by plotting a temperature cross-over curve, wherein both the ambient temperature and the temperature of the contact are plotted during the operating and the cooling down, wherein if the temperature of the contact and the ambient temperature cross on the temperature cross-over curve, a high freeze potential of the relay is determined and if the temperature of the contact and the ambient temperature do not cross on the temperature cross-over curve, a low freeze potential of the relay is determined.

* * * * *